United States Patent [19]

Ohsima et al.

[11] 4,319,259

[45] Mar. 9, 1982

[54] ELECTROLUMINESCENT ELEMENT

[75] Inventors: Masaaki Ohsima, Yokohama; Isamu Akasaki, machida, both of Japan

[73] Assignee: Matsushita Electric Industrial Co., Ltd., Osaka, Japan

[21] Appl. No.: 142,712

[22] Filed: Apr. 22, 1980

[30] Foreign Application Priority Data

Apr. 23, 1979 [JP] Japan .................................. 54/50124

[51] Int. Cl.$^3$ ............................................. H01L 27/14
[52] U.S. Cl. ...................................... 357/17; 357/16; 357/61
[58] Field of Search ....................... 428/917, 332, 336; 357/16, 17, 61

[56] References Cited

U.S. PATENT DOCUMENTS

| | | | |
|---|---|---|---|
| 3,821,777 | 6/1974 | James | 357/16 X |
| 3,990,101 | 11/1976 | Ettenberg | 357/16 |
| 4,038,580 | 7/1977 | Porret | 357/17 X |
| 4,213,138 | 7/1980 | Campbell | 357/17 X |
| 4,258,375 | 3/1981 | Hsieh | 357/16 |

*Primary Examiner*—Martin H. Edlow
*Attorney, Agent, or Firm*—Lowe, King, Price & Becker

[57] ABSTRACT

An electroluminescent element comprising an n-type GaAs substrate, a GaAsP grading layer and an n-type GaAsP constant layer both of which are grown on the substrate epitaxially in this order, and an $In_xGa_{1-x}As_yP_{1-y}$ layer formed on top of the constant layer where $0.002 \leq x \leq 0.08$ and $0.2 \leq y \leq 0.4$.

4 Claims, 5 Drawing Figures

ELECTROLUMINESCENT ELEMENT

BACKGROUND OF THE INVENTION

Field of the Invention

This invention relates to light-emitting semiconductor devices and more particularly, to an improved electroluminescent element.

DESCRIPTION OF THE PRIOR ART

Most commonly employed luminescent elements or diodes are red- and green-emitting luminescent diodes of GaP and red-emitting luminescent diodes of GaAsP. With the GaP diodes, the luminescent efficiencies are about 2% for the red emission and about 0.1% for the green emission, respectively. In case of the GaAsP diodes, the efficiency is about 0.4% but where visibility is taken into account, the luminescence of the GaAsP diodes is poorer than those of red and green light emitted from the GaP diodes.

However, GaAsP is possible to be grown on a GaAs substrate, which is more inexpensive than GaP, by a very mass-producible method, i.e. a vapor phase growth method and has thus a merit that the cost of production can be reduced.

In the red-emitting luminescent diode using GaP, an increase of brightness with electric current is at most up to about 10 mA and application of a more increased electric current does not result in an increase of brightness. This is because there is a limit in number of Zn—0 pairs to be luminous centers of the GaP diode. In this connection, however, the luminous or luminescent diode of GaAsP gives off light based on a so-called band transition, so that the luminous strength increases with an increase of electric current. Accordingly, the luminous strength increases with an increase of electric current up to several hundreds mA provided there is used a heat sink which is good at radiation characteristics. The luminous brightness is much greater than that attained by GaP diodes. In this sense, light-emitting GaAsP diodes are very useful as a light source which needs a high level of brightness in a system whose current capacity is more than enough.

SUMMARY OF THE INVENTION

It is accordingly an object of the present invention to provide an GaAsP-base electroluminescent element whose efficiency of luminescence is improved to 1.5-2 times as great as that of prior art GaAsP diodes.

It is another object of the present invention to provide an electroluminescent element using an In-containing GaAsP layer by which its luminescent efficiency becomes comparable to that of GaP diodes.

The above objects can be achieved by an electroluminescent element according to the invention which comprises an n-type GaAs substrate, a GaAsP grading layer and an n-type GaAsP constant layer both of which are grown on the substrate epitaxially in this order, and an In-doped GaAsP layer formed on top of the constant layer, the In-containing GaAsP layer being made of a crystal having a composition of the formula

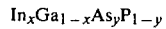

$In_xGa_{1-x}As_yP_{1-y}$ where $0.002 \leq x \leq 0.08$ and $0.2 \leq y \leq 0.4$.

In a preferred aspect, x is in the range of 0.01 to 0.068.

In addition, the thickness of the In-containing GaAsP layer is preferably in the range of $0.8\mu$ to $3.9\mu$ and most preferably in the range of $0.8\mu$ to $3.3\mu$.

BRIEF DESCRIPTION OF THE DRAWINGS

Other objects and advantages of the invention will become apparent from the following description when taken in conjunction with the accompanying drawings in which.

DESCRIPTION OF EMBODIMENTS

Figure 1:
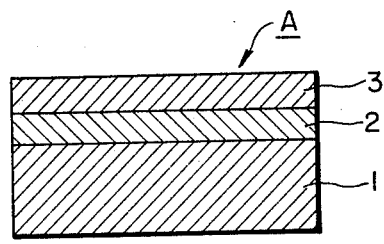
FIG. 1 is a schematical sectional view of a known electroluminescent diode of GaAsP.

With reference now to FIG. 1, there is shown a commercially available $GaAs_{0.6}P_{0.4}$ substrate generally indicated by A. The substrate A includes an n-type GaAs layer 1 which contains a donor in an amount of $1 \times 10^{18}/cm^3$, and a grading layer 2 through which a difference in lattice constant between GaAs and GaAsP is gradually reduced. On the grading layer is formed a GaAsP layer 3 of a constant lattice constant (i.e. a constant layer) which usually contains about $1 \times 10^{17}/cm^3$ of a donor and is arranged to show a peak of luminescence at 6600 Å in a phosphorus concentration of about 40%.

According to a known procedure, the GaAsP substrate composed of the three layers is placed under vacuo in a sealed ampule together with Zn where Zn is diffused in a solid state at about 750° C. to form a p-n junction in the GaAsP constant layer. The thickness of the diffused layer is in the order of $1-2\mu$ which is considered sufficient to avoid a substantial absorption of light. The luminescent diode made by such method is then attached with electrodes as usual to check its luminescent efficiency, revealing that the efficiency is about 0.4–0.5% on application of an electric current of 20 mA to the diode.

Figure 2:
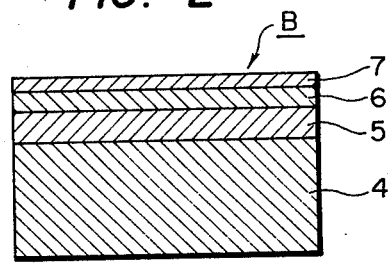
FIG. 2 is a schematical sectional view of an electroluminescent element according to the present invention.

FIG. 2 shows a GaAsP luminescent diode according to one embodiment of the invention which is generally indicated by B. The diode B has an n-type substrate 4, on which an n-type GaAsP grading layer 5 and an n-type GaAsP constant layer 6 are successively grown epitaxially by a vapor phase growth method. On top of the constant layer 6 is further formed a GaAsP layer 7 containing a very small amount of In (hereinlater referred to as InGaAsP layer) by a liquid phase growth method to form a p-n junction between this layer 7 and the n-type GaAsP layer 6. It is important to note that the luminescent efficiency is much improved by the addition of a very small amount of In to the GaAsP top layer.

Figure 3:
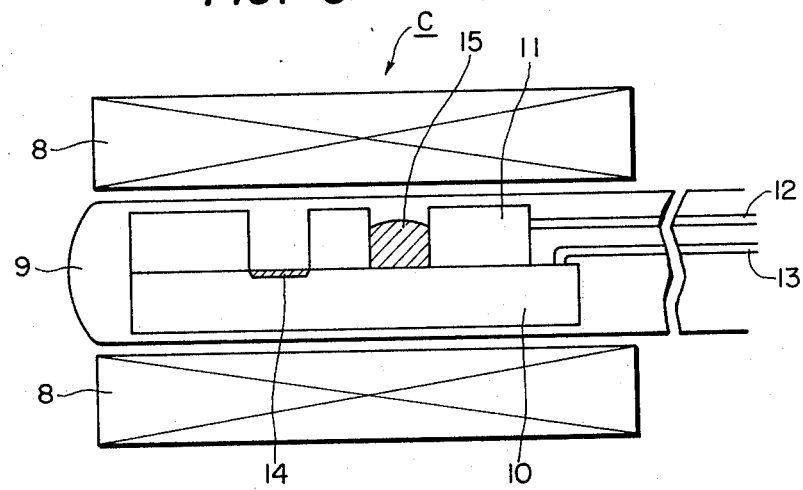
FIG. 3 is a schematical view of a liquid phase growth apparatus for making an electroluminescent element according to the invention.

A method of adding In to the GaAsP layer 7 by the liquid phase growth technique will be described with reference to FIG. 3. FIG. 3 shows a growth system using a horizontal slide boat. The system is generally indicated by C and includes electric furnaces 8, a quartz tube 9 and graphite boats 10 and 11 as shown. The boat 11 is set in position by the action of a bar 12 while the boat 10 is slidably movable with respect to the boat 10 by means of a pulling bar 13, by which it is possible that a substrate 14 is contacted with or removed from a melt 15 in the boat 11.

In operation, a $GaAs_{0.6}P_{0.4}$ substrate as shown in FIG. 1 is, for example, set in the boat 10. Similarly, a mixture of, for example, 2 g of Ga, 10 mg of GaP, 38 mg of GaAs, 12 mg of In and 5 mg of Zn is charged in the boat 11 as the melt 15. The atmosphere in the quartz tube 9 is replaced by hydrogen and the system is heated to 750° C. by means of the electric furnaces 8 and maintained at the same temperature for about 60 minutes. Then, the temperature is dropped at a rate of 0.5° C./min and simaltaneously the pulling bar 13 is moved to bring the substrate to contact with the melt 15. The epitaxial growth is continued for 6 minutes, after which the substrate is removed from the melt 15 and its temperature is dropped to room temperature. The thus grown InGaAsP layer 7 has a thickness of about $2\mu$ and the X-ray analysis reveals that the layer is made of a crystal having a composition of the formula, $In_xGa_{1-x}As_yP_{1-y}$ where x is 0.02 and y is 0.61. When similar diodes are made and each attached with ohmic electrodes as usual to measure their luminescent efficiency, it has been found that the efficiency at 6600 Å is as high as 0.9% to 1.1% when an electric current of 20 mA is applied for the measurement.

Figure 4:
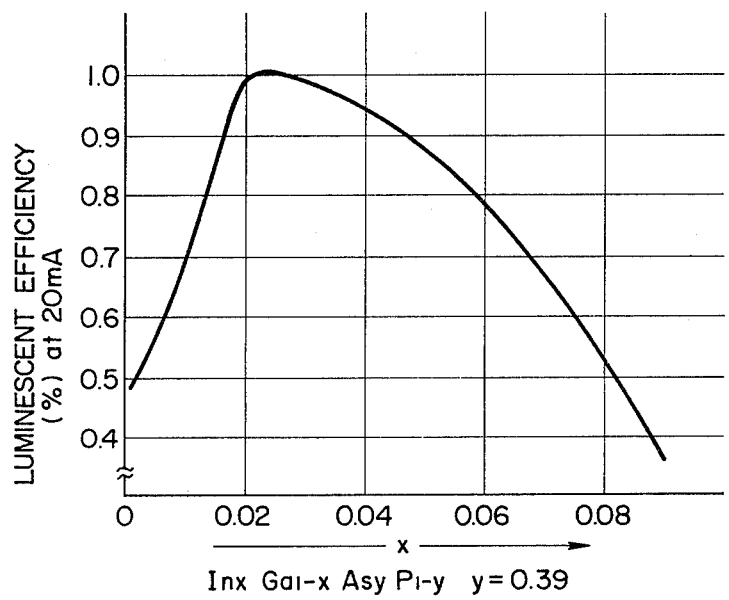
FIG. 4 is a graphical representation of a luminescent efficiency of the element of the invention in relation to variation in x of $In_xGa_{1-x}As_{0.61}P_{0.39}$.

Similarly to the procedure as described above, diodes are made to determine a variation of luminous efficiency in relation to a content of In in the InGaAsP layer. The results are shown in FIG. 4 in which the abscissa shows a content, x, of In. It will be noted that in this test, the content of As is held constant at 0.39. As will be clear from the curve of FIG. 4, the luminous efficiency of the diodes according to the invention is more excellent within a range of x where $0.002 \leq x \leq 0.08$ than the known GaAsP luminescent diode which has been made by a known diffusion technique. In a preferred aspect, x should be in the range of 0.01 to 0.068. Similar results are obtained when y is in the range of from 0.2 to 0.4.

Figure 5:
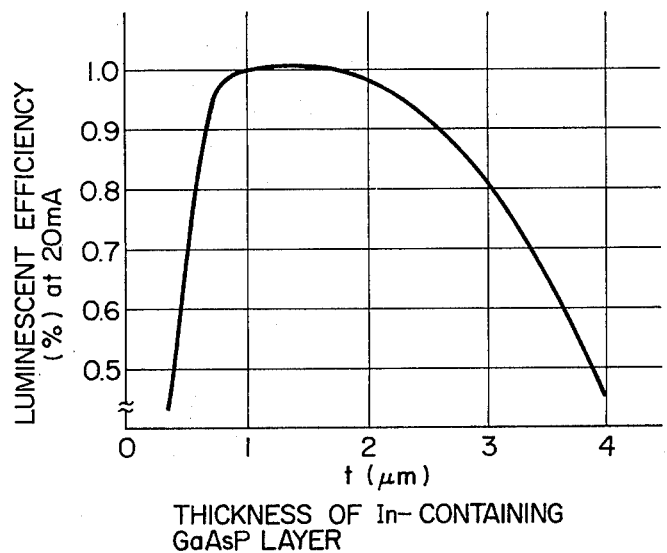
FIG. 5 is a graphical representation of a luminescent efficiency of the element according to the invention in relation to variation in thickness, t, of the InGaAsP layer.

Then, electroluminescent diodes having an $In_xGa_{1-x}As_yP_{1-y}$ top layer where $x=0.02$ and $y=0.61$ are made in the same procedure as described in the foregoing to know a relation between a thickness of this layer and the luminescent efficiency, with the results shown in FIG. 5.

As will be clear from the figure, the luminescent efficiency sharply decreases when the epitaxial layer is in a thickness of below $0.8\mu$. Presumably, this is because when the epitaxial layer is so thin, the crystallinity becomes deteriorated due to application of electrodes. On the other hand, when the thickness of the epitaxial layer is above $3.9\mu$, the luminescent efficiency of the diode is almost the same as that of a known LED made by the diffusion technique. This is believed due to a fact that the emitted light is absorbed by so thick a crystal layer. From this, the thickness, t, of the epitaxial layer is preferably in the range of $0.8\mu$ to $3.9\mu$ and most preferably in the range of $0.8\mu$ to $3.3\mu$.

As will be understood from the foregoing, the electroluminescent element of the invention in which an $In_xGa_{1-x}As_yP_{1-y}$ layer where $0.002 \leq x \leq 0.08$ and $0.2 \leq y \leq 0.4$ is formed on an n-type GaAsP substrate shows an improved luminescent efficiency over known GaAsP luminescent diodes. Needless to say, the improvement in the luminescent efficiency results from the In-containing GaAsP crystal. This crystal may be also applied to semiconductor laser systems as an active or buffer layer.

What is claimed is:

1. An electroluminescent element comprising an n-type GaAs substrate, a GaAsP grading layer and an n-type GaAsP constant layer both of which are grown on said substrate epitaxially in this order, and an In-containing GaAsP layer formed on top of said constant layer, the In-doped GaAsP layer being made of a crystal having a composition of the formula,

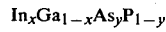

$$In_xGa_{1-x}As_yP_{1-y}$$

where $0.002 \leq x \leq 0.08$ and $0.2 \leq y \leq 0.4$.

2. An electroluminescent element according to claim 1, wherein x is in the range of from 0.01 to 0.068.

3. An electroluminescent element according to claim 1, wherein the thickness of the In-doped GaAsP layer is in the range of $0.8\mu$ to $3.9\mu$.

4. An electroluminescent element according to claim 3, wherein the thickness is in the range of $0.8\mu$ to $3.3\mu$.

* * * * *